(12) United States Patent
Chandran et al.

(10) Patent No.: US 8,324,737 B2
(45) Date of Patent: Dec. 4, 2012

(54) MODIFIED CHIP ATTACH PROCESS

(75) Inventors: Biju Chandran, Chandler, AZ (US);
Sandeep B Sane, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/042,239

(22) Filed: Mar. 7, 2011

(65) Prior Publication Data
US 2011/0156254 A1    Jun. 30, 2011

Related U.S. Application Data

(60) Continuation of application No. 12/502,088, filed on Jul. 13, 2009, now Pat. No. 7,901,982, which is a continuation of application No. 11/930,760, filed on Oct. 31, 2007, now Pat. No. 7,579,213, which is a division of application No. 11/167,509, filed on Jun. 27, 2005, now Pat. No. 7,304,391, which is a division of application No. 10/675,880, filed on Sep. 30, 2003, now Pat. No. 6,919,224.

(51) Int. Cl.
| H01L 23/48 | (2006.01) |
| H01L 23/52 | (2006.01) |
| H01L 29/40 | (2006.01) |

(52) U.S. Cl. . 257/779; 257/701; 257/704; 257/E21.499; 257/E21.503; 257/E21.508; 257/E21.511

(58) Field of Classification Search .................. 257/779, 257/678, 701, 704, 737, 780, 781, 782, 783, 257/772, 777, 714, 793, E21.499, E21.508, 257/E21.503, E21.511, 778
See application file for complete search history.

(56) References Cited

U.S. PATENT DOCUMENTS

| 4,771,929 A | 9/1988 | Bahr et al. |
| 6,228,678 B1 | 5/2001 | Gilleo et al. |
| 6,228,681 B1 | 5/2001 | Gilleo et al. |
| 6,258,627 B1 | 7/2001 | Benenati et al. |
| 6,333,209 B1 | 12/2001 | Coico et al. |
| 6,573,122 B2 | 6/2003 | Standing |
| 6,919,224 B2* | 7/2005 | Sane et al. ............ 438/106 |
| 7,304,391 B2* | 12/2007 | Sane et al. ............ 257/779 |
| 7,579,213 B2* | 8/2009 | Sane et al. ............ 438/106 |
| 7,901,982 B2* | 3/2011 | Sane et al. ............ 438/106 |
| 2005/0070044 A1 | 3/2005 | Sane et al. |
| 2006/0003496 A1 | 1/2006 | Sane et al. |
| 2008/0057628 A1 | 3/2008 | Sane et al. |

OTHER PUBLICATIONS

U.S. Appl. No. 10/675,880 Non-Final Office Action mailed Nov. 12, 2004, 5 pgs.
U.S. Appl. No. 10/675,880 Notice of Allowance mailed Mar. 16, 2005, 7 pgs.
U.S. Appl. No. 10/675,880 Response filed Feb. 10, 2005 in response to Non-Final Office Action mailed Nov. 12, 2004, 8 pgs.
U.S. Appl. No. 10/675,880 Response to Restriction Requirement and Preliminary Amendment filed Oct. 12, 2004, 5 pgs.
U.S. Appl. No. 11/167,509 Notice of Allowance mailed Jul. 17, 2007, NOAR, 4 pgs.
U.S. Appl. No. 11/930,760 Notice of Allowance mailed Apr. 20, 2009, 5 pgs.

* cited by examiner

*Primary Examiner* — David Nhu
(74) *Attorney, Agent, or Firm* — Blakely, Sokoloff, Taylor & Zafman LLP

(57) ABSTRACT

A process for assembling a package for a semiconductor device comprising reducing the stress in an inner dielectric layer during packaging by heating the die and the substrate to a temperature where a solder reflows, dropping to a temperature where a selected epoxy will cure, liquefying the epoxy, adding the liquefied epoxy to the die and substrate, and maintaining the die and substrate at a temperature where the epoxy cures for a selected amount of time.

6 Claims, 6 Drawing Sheets

MODIFIED CHIP ATTACH PROCESS

RELATED APPLICATION(S)

This application is a Continuation of U.S. application Ser. No. 12/502,088, filed on Jul. 13, 2009, Pat. No. 7,901,982 which is a Continuation of U.S. application Ser. No. 11/930,760, filed on Oct. 31, 2007 and issued as U.S. Pat. No. 7,579,213 on Aug. 24, 2009, which is a Divisional of U.S. application Ser. No. 11/167,509 filed Jun. 27, 2005 and issued as U.S. Pat. No. 7,304,391 and issued on Dec. 4, 2007, which is a Divisional of U.S. application Ser. No. 10/675,880 filed on Sep. 30, 2003 and issued as U.S. Pat. No. 6,919,224 on Mar. 31, 2005, all of which are incorporated herein by reference in their entirety.

FIELD OF THE INVENTION

The present invention relates generally to apparatus and methods for packaging a device. More particularly, it relates to modified chip attach process and apparatus used for packaging a device.

BACKGROUND OF THE INVENTION

Typically a large number of semiconductor devices are formed on wafers. The semiconductor devices are formed by repeating a number of basic operations on a wafer. The basic operations include layering, patterning, doping, and heat processing. The final semiconductor formed has many layers of material and includes as many as 10,000 or more individual transistors. Rather than make each semiconductor device individually, a number of devices are formed on a single wafer. The entire wafer is subjected to the basic operations discussed above in order to form hundreds of semiconductor chips or devices. Typically, after the semiconductor devices are formed, the semiconductor devices are tested and sorted. Next, the wafer is sliced and diced so that each individual semiconductor device is separated from the others formed on the wafer.

The individual semiconductor devices are formed on fragile material. As a result, the individual semiconductor devices are packaged, in part for physical protection. Packaging also dissipates the heat from the semiconductor and provides connections or leads between the individual chip or die and an exterior portion of the package. The leads allow for electrical connection between the chip or die and a printed circuit board or other device.

There are many different types of packages. One common package is a flip chip package which has a series of bumps or balls or leads formed in an array on a surface of a substrate. The substrate includes a number of pads, typically laid out in an array. Solder individually, or mixed with flux is deposited onto the pads and then the substrate is heated. The heat applied is sufficient to reflow the solder and melt the solder to a liquid state. The flux material is used to clean the metal pads on the die and the substrate, and the solder of any oxides that may have been formed on it. Removal of the oxides allows for good solder wetting and good joint formation. The material surrounding the solder pad typically repels or resists the liquid solder. The liquid solder, therefore, wets to the surface of the pad and the surface tension of the liquid solder causes the solder to form a ball or bump. The ball or bump shape is maintained while the solder cools. The silicon die along with the substrate and the interconnections between them is referred to as an electronic package or simply the "package". Typically, the entire package is heated and cooled to attach the die to the substrate. In most manufacturing processes, the package is reheated and cooled a number of additional times as the part of the manufacturing process. The die or chip within the package is also reheated and cooled an additional number of times. In some packaging operations, the package is reheated to clean the package of residual flux that may be burnt and charred during the die to substrate assembly process. A liquid is typically used to clean the package of excess solder, and the package is cooled. The next step is to reheat the package again to drive off any remaining liquid that may have been absorbed by the packaging materials during the residual flux cleaning operation. The substrate is then cooled. Finally, an epoxy is used to encapsulate the solder balls between the die and the substrate. Part of the encapsulation includes placing epoxy between the die and the package. This is referred to as underfilling the package. The epoxy can be pressurized during underfill or the epoxy can be heated and capillary action used to underfill the package. The epoxy adhesive is heated so that the epoxy flows into the spaces between the die and the substrate. The substrate and die or chip are then cooled again. A lid can then be placed on the package. After the packaging process is complete, heat is then managed using heat sinks or the like with the package as it operates.

Partial encapsulation is discussed above. Another common package used for flip chips is a molded epoxy enclosure. In this type of package, the die is attached to a lead frame. Then the entire die and lead frame is placed in a mold. The lead frame and the package is then surrounded with epoxy material that has been softened and heated previously. Although the process is somewhat different, it should be noted that the die or chip is subjected to repeated heating and cooling.

When the layers in a die or chip are subjected to thermal cycling of the magnitude as from reflowing the solder, washing away excess flux, driving off liquid from the washing operation and from either underfilling the space between the chip and the substrate or molding the package around the chip or die, delamination may occur between the layers in the die or chip. The repeated thermal cycles during the chip or die attach process cause delamination of the inner layer dielectrics (ILD) on the die. The ILD is a fragile, thin film layer. When delamination occurs, the chip or die fails. The delamination may result in significant yield losses. The delamination of the ILD may not only cause current failures, but can also cause latent failures that occur after the chip has left the manufacturing site. Failure of components is never desirable and generally requires more effort when the chip is in the field and must be replaced.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

Figure 1A:
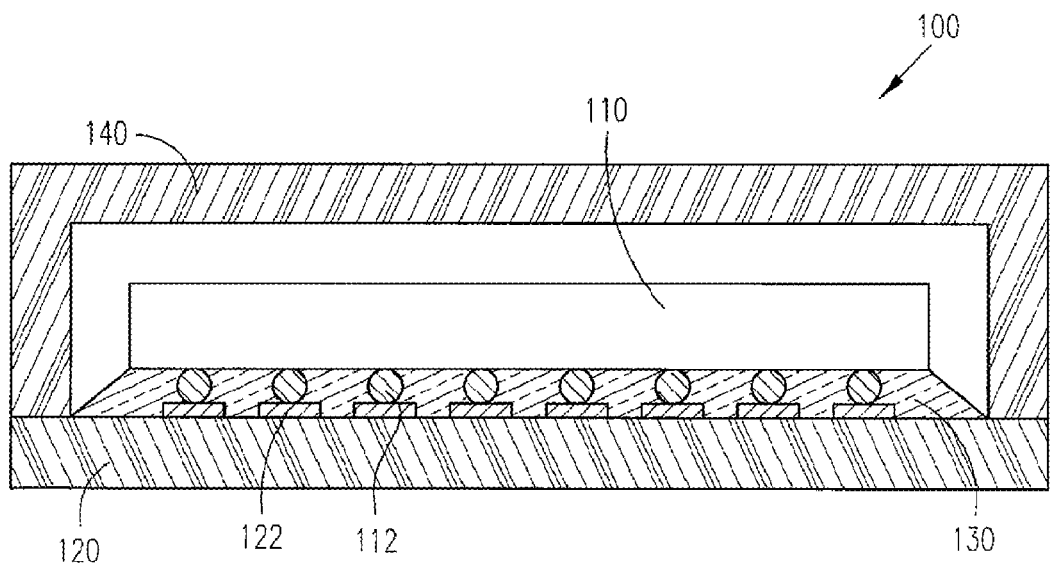
FIG. 1A is schematic cutaway view of a semiconductor package, according to an embodiment of the invention.

The description set out herein illustrates the various embodiments of the invention and such description is not intended to be construed as limiting in any manner.

DETAILED DESCRIPTION

In the following detailed description, reference is made to the accompanying drawings, which are not necessarily to scale, which form a part hereof, and in which is shown, by way of illustration, specific embodiments in which the apparatus and methods can be practiced. These embodiments are described in sufficient detail to enable those skilled in the art to practice them, and it is to be understood that the embodiments can be combined, or that other embodiments can be utilized and that procedural changes can be made without departing from the spirit and scope of the present invention. The following detailed description is, therefore, not to be taken in a limiting sense, and the scope is defined by the appended claims and their equivalents. In the drawings, like numerals describe substantially similar components throughout the several views.

Figure 1B:
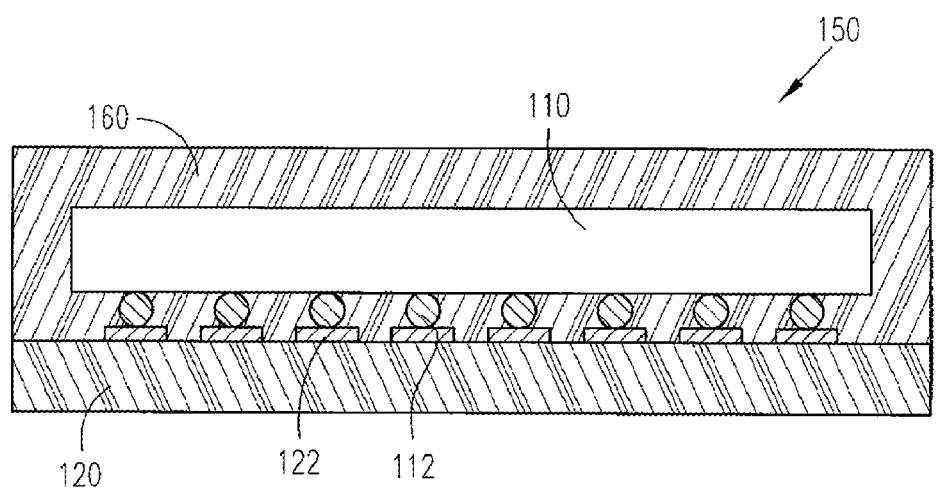
FIG. 1B is schematic cutaway view of a semiconductor package, according to an embodiment of the invention.

FIGS. 1A and 1B are schematic cutaway views of semiconductor packages, according to an embodiment of the invention. FIG. 1A is a schematic cutaway view of a semiconductor package 100. The semiconductor package 100 includes a die 110 and a substrate 120. The die 110 is attached to the substrate 120 with solder 112. The solder 112 is actually formed into solder balls on one surface of the die 110. The substrate 120 includes pads 122. The pads 122 are arranged on the substrate 120 in the same geometric configuration or layout as the solder balls 112 on the substrate 110. The substrate 110 and the solder balls 112 are placed on to the pads 122 of the substrate and the substrate 120 and die or chip 110 is heated so that the solder reflow and connects the die 110 to the pads 122 of the substrate 120. As shown in FIG. 1A, the space between the substrate 120 and the die or chip 110 is underfilled with the curable substance, such as an epoxy. As shown in FIG. 1A, the underfill area has a reference numeral 130. It should be noted that an underfilled area 130 can be formed either by capillary action or by injection. Underfilling by capillary action is generally less stressful on the chip or die 110. After the underfill area 130 is formed, a cap or lid 140 is placed onto the substrate to complete the semiconductor package 100.

FIG. 1B shows a second type of semiconductor package 150. The semiconductor package includes a chip or die 110 and a substrate 120. The die 110 has balls of solder 112 arranged in a pattern on one side of the die 110. The substrate 120 includes a plurality of pads 122 that are arranged in a similar geometric shape so that the solder balls 112 align with the pads 122 of the substrate. An epoxy material or other curable material 160 is over molded around the die 110 and the substrate 120 to complete the semiconductor package 150. Over molding generally requires injection of a curable substance such as epoxy or a similar substance.

Figure 2:
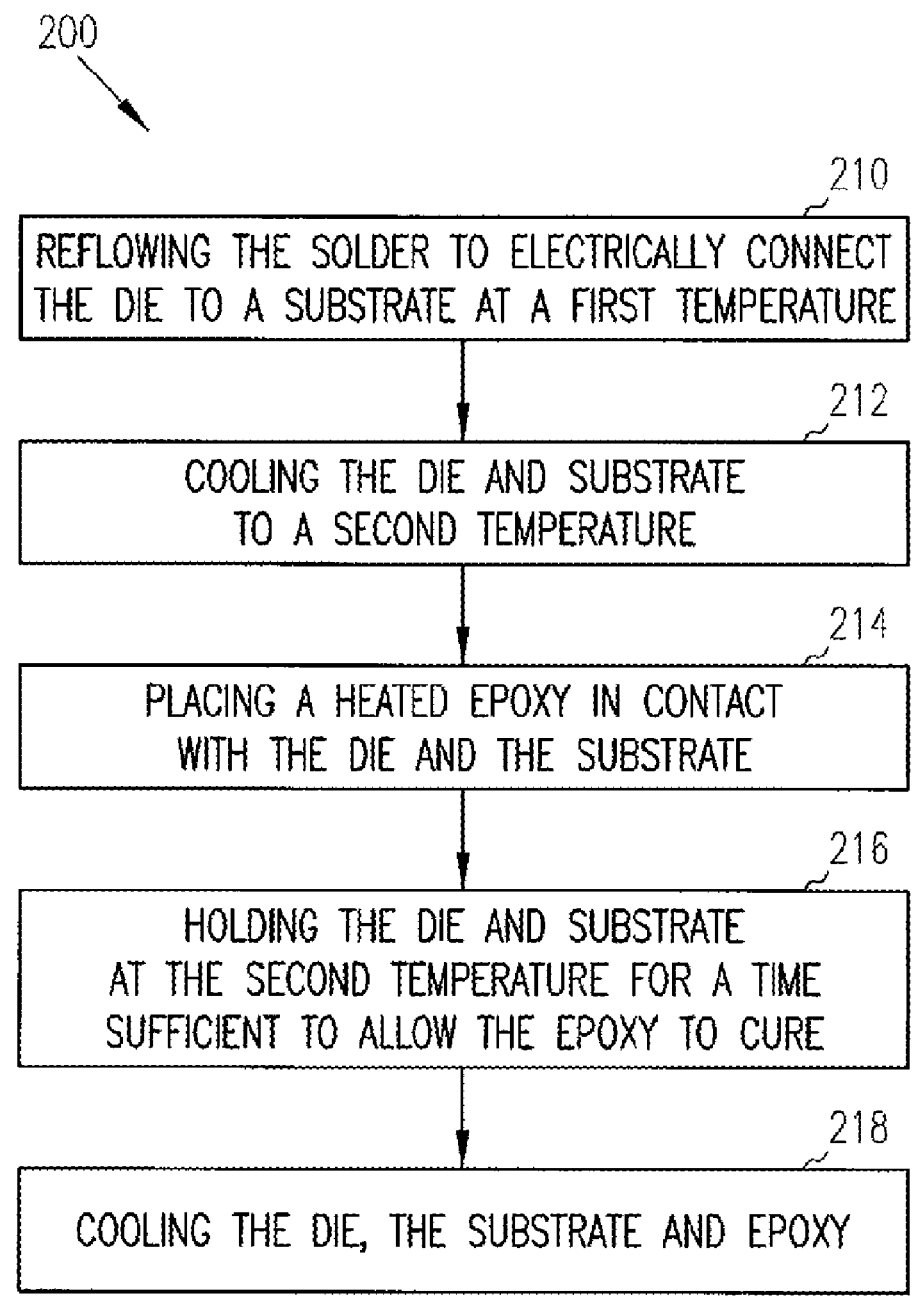
FIG. 2 is a flow chart of a method for forming a semiconductor package, according to an embodiment of the invention.

FIG. 2 is a flow chart of a method 200 for attaching a die to a substrate thereby forming a semiconductor package, according to an embodiment of the invention. The method 200 of packaging a die includes reflowing the solder to electrically connect the die to a substrate at a first temperature 210, cooling the die and substrate to a second temperature 212, and placing a heated epoxy or another curable material in contact with the die and the substrate 214. The method 200 further includes holding the die and substrate at the second temperature for a time sufficient to allow the epoxy to cure 216, and cooling the die, substrate and epoxy 218. The second temperature that the epoxy or other material cures at is less than the first temperature. The die and substrate are not cooled to a temperature significantly below the second temperature until after the heated epoxy is placed in contact with the die and substrate 214. In other words, the die and substrate are not heated and cooled to room temperature in a first reflow step and then heated and cooled in a step where epoxy or another curable material is placed in contact with the die. As a result, at least one thermal cycle of the die and substrate is eliminated. This in turn reduces the amount of stress placed on the die and substrate and also reduces the amount of stress on the inner layer dielectrics (ILD) of the die. The ILD is a fragile, thin film layer. Reduction of the stress at the ILD also reduces the chance for delamination at the ILD. As mentioned previously, when delamination occurs at the ILD, the chip or die fails so reducing the chance for delamination at the ILD improves yields, especially in certain semiconductor packages, such as packages that include dies having a fragile, thin film layers in the ILD. It should be noted that delamination of the ILD may not only cause current failures, but can also cause latent failures that occur after the semiconductor package has left the manufacturing site. As a result, reducing the number of thermal cycles during chip attach and packaging also decreases the number of field failures of the semiconductor package since there will be a lesser number of latent failures due to delamination. In addition, the invention as set forth above and below, reduces the amount of time required to form the semiconductor package. The reduced amount of time for assembly translates into a reduced cost for packaging the semiconductor.

In some embodiments, placing heated epoxy in contact with the die and the substrate 214 includes underfilling the space between the die and the substrate. In other embodiments of the invention, the die and substrate are overmolded with epoxy or some other curable material to form the package. The method further includes placing a lid over the die and the substrate. Placing the heated epoxy in contact with the die and the substrate includes overmolding the die, according to one embodiment of the invention. According to an embodiment of the invention, after solder reflow, the die and substrate remain above or at the second temperature until the epoxy cures. The second temperature is sufficiently lower than the first temperature to allow the reflowed solder to solidify. The method also includes selecting an epoxy that cures at a temperature near the temperature associated with reflow of the solder. The method further includes selecting a flux that does not leave a residue as a result of reflow.

Figure 3:
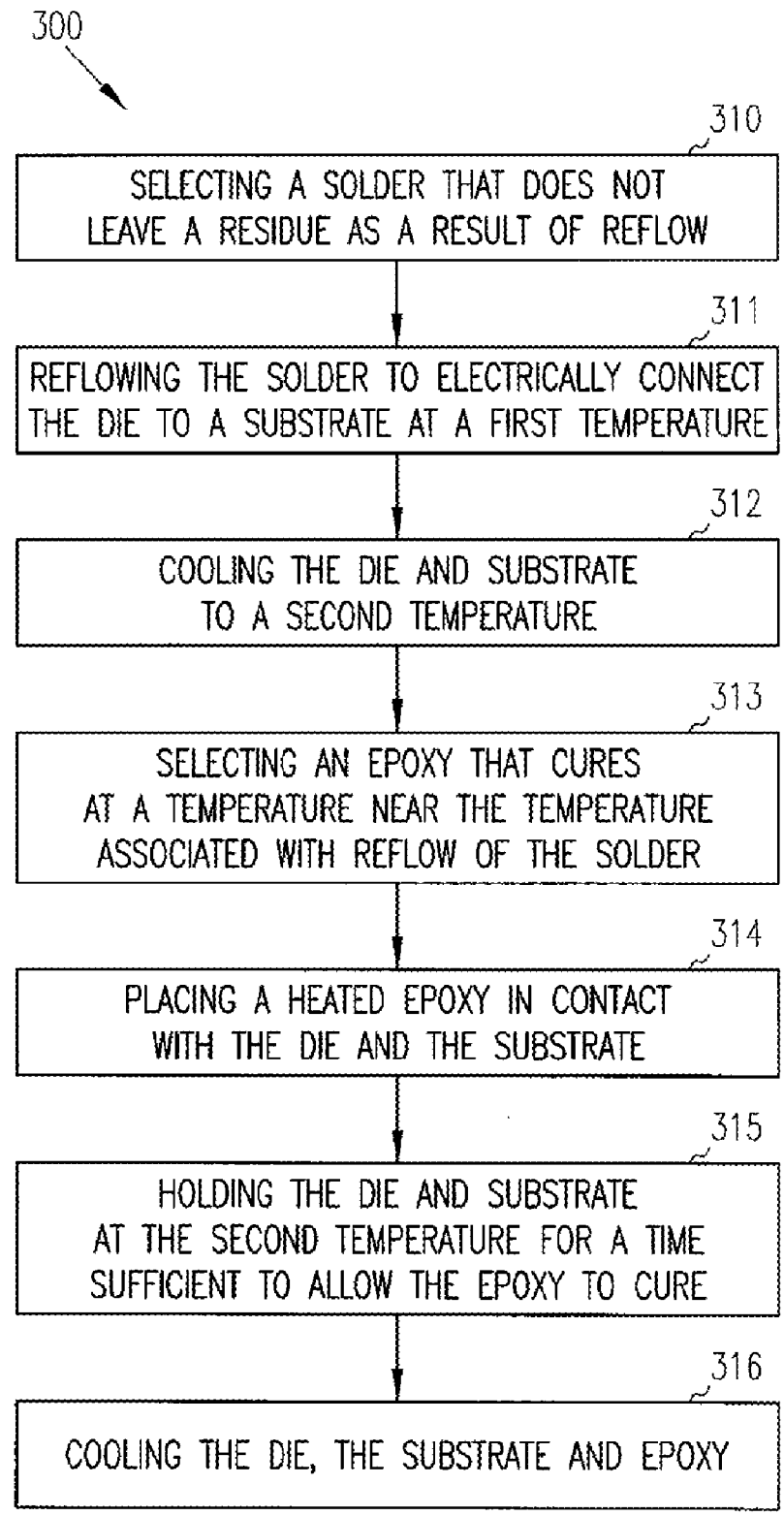
FIG. 3 is a flow chart of a method for forming a semiconductor package, according to another embodiment of the invention.

FIG. 3 is a flow chart of a method 300 for forming a semiconductor package, according to another embodiment of the invention. The method 300 of packaging a die includes selecting a solder that does not leave a residue as a result of reflow 310, reflowing the solder to electrically connect the die to a substrate at a first temperature 311, and cooling the die and substrate to a second temperature 312. The method 300 includes selecting an epoxy that cures at a temperature near the temperature associated with reflow of the solder 313, placing a heated epoxy or another curable material in contact with the die and the substrate 314, holding the die and substrate at the second temperature for a time sufficient to allow the epoxy to cure 315, and cooling the die, substrate and epoxy 316. The second temperature that the epoxy or other material cures at is less than the first temperature. The die and substrate are not cooled to a temperature significantly below the second temperature until after the heated epoxy is placed in contact with the die and substrate 314. Of course, the epoxy or other curable material with a curing temperature near the reflow temperature must have a curing temperature which is less than the reflow temperature of the solder used on the die so that as the epoxy or other curable material cures, the solder does not reflow. Generally, the higher the curing temperature the shorter the time required to cure the curable material. Therefore, a material having a cure temperature close to the temperature for reflow will be desirable since the time required to reflow the solder 311 and cure the epoxy will be minimized. Of course, other factors must be considered in choosing the epoxy or other curable material that forms at least a portion of the semiconductor package.

As a result, at least one thermal cycle of the die and substrate is eliminated. More than likely several additional thermal cycles are also eliminated. Selecting a solder that does not leave a residue as a result of reflow 310 eliminates thermal cycling due to washing solder residue and heating the package to drive off any liquid that remains from washing the die and substrate of any solder residue. Again, this reduces the amount of stress placed on the die and substrate and also reduces the amount of stress on the inner layer dielectrics (ILD) of the die. The ILD is a fragile, thin film layer. Reduction of the stress at the ILD also reduces the chance for delamination at the ILD. Elimination of any washing step and subsequent step to drive off liquids that remain from washing also reduces the time needed to attach a die to a substrate and form a semiconductor package. The reduced amount of time for assembly translates into a reduced cost for packaging the semiconductor.

Figure 4:
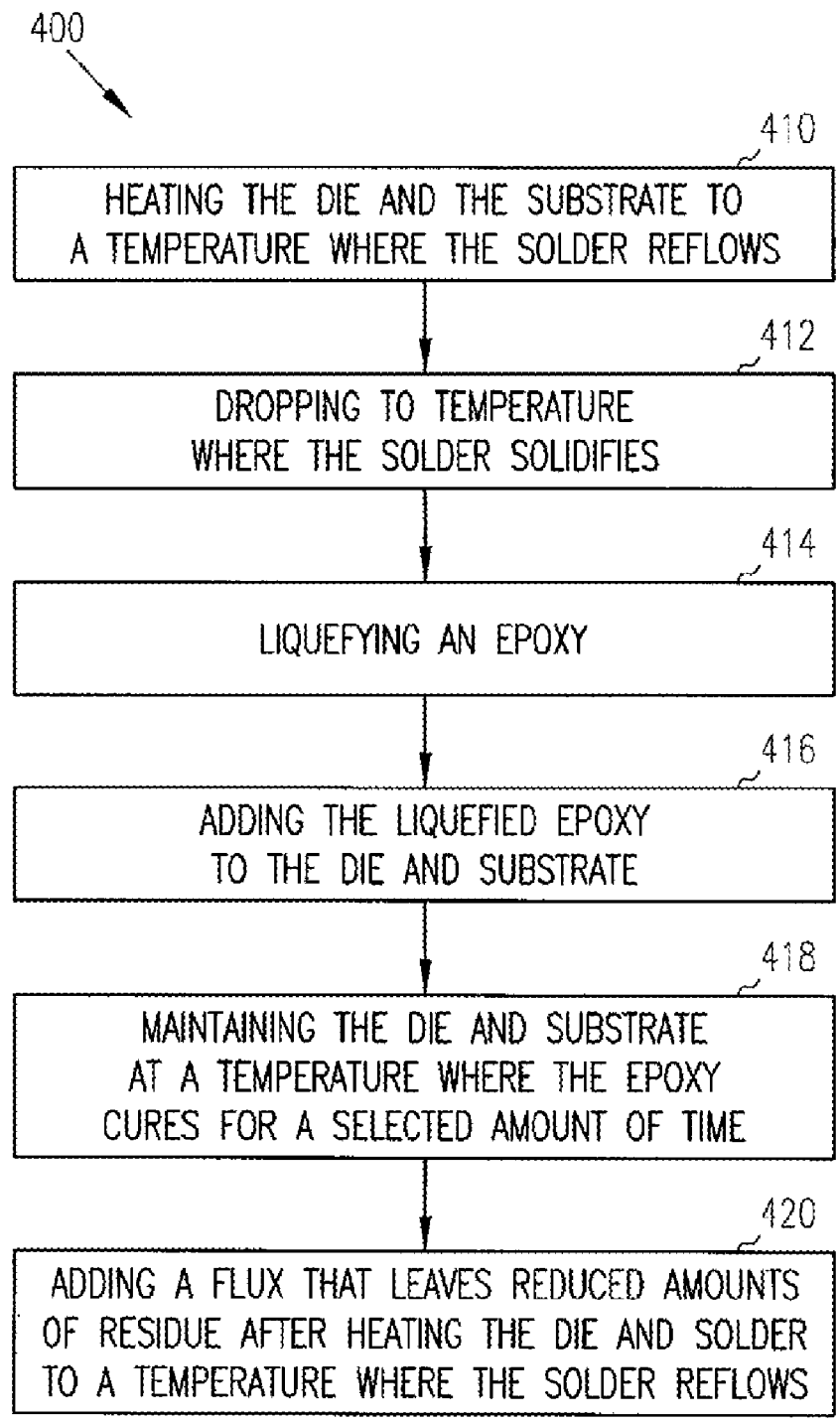
FIG. 4 is a flow chart of a method for forming a semiconductor package, according to yet another embodiment of the invention.

FIG. 4 is a flow chart of a process 400 for forming a semiconductor package, according to yet another embodiment of the invention. The process 400 for assembling a package for a semiconductor device includes reducing the stress in an inner dielectric layer during packaging by heating the die and the substrate to a temperature where the solder reflows 410, dropping to a temperature where a selected epoxy will cure 412, liquefying the epoxy 414, adding the liquefied epoxy to the die and substrate 416, and maintaining the die and substrate at a temperature where the epoxy cures for a selected amount of time 418. The process also includes adding a flux that leaves reduced amounts of residue after heating the die and solder to a temperature where the solder reflows 420. The steps of cleaning the die of excess flux residue and driving off the excess liquid are eliminated. Adding the liquefied epoxy to the die and substrate includes underfilling the space between the die and substrate with liquefied epoxy. In one embodiment of the invention, capillary action is used to underfill the space between the die and the substrate. In another embodiment of the invention, the epoxy is pressurized and injected into the space between the die and the substrate to underfill the space between the die and the substrate. Underfilling using capillary action places less stress and less force on the die and, so, is very useful in packaging dies that are fragile or that have ILDs that are prone to delamination. Underfilling using capillary action can be followed by placing a lid on the die to complete the semiconductor package.

Figure 5:
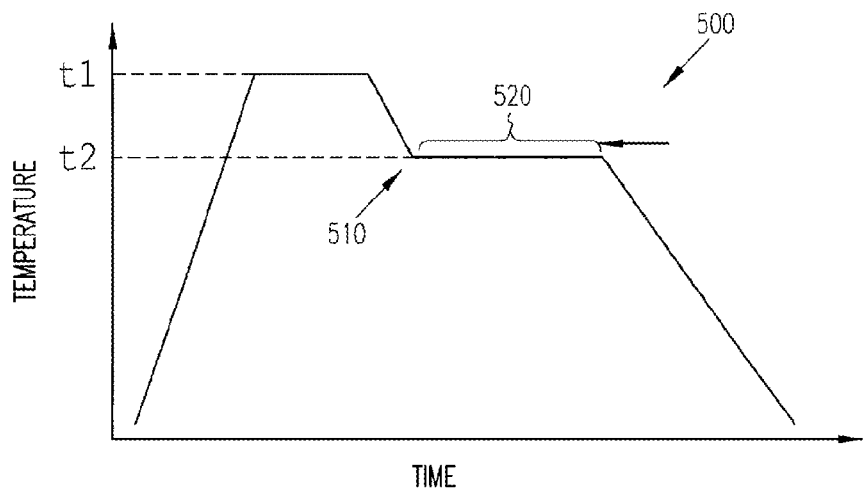
FIG. 5 is a graph showing the temperature of the semiconductor package with respect to time, according to an embodiment of this invention.

FIG. 5 is a graph 500 showing the temperature of the semiconductor package with respect to time, according to an embodiment of this invention. The graph 500 shows the temperature of the semiconductor package 100, 150 with respect to time during the manufacturing process. Specifically, the time is on the horizontal or X axis, and temperature is on the Y or vertical axis in graph 500. The temperature is initially brought up to a first temperature depicted by temperature $t_1$ and is held at temperature $t_1$ for a sufficient amount of time to allow the solder ball 112 of the die to reflow and connect to the substrate 120. The solder balls 112 and substrate 120 are not shown in FIG. 5, but rather can be seen in FIGS. 1A and 1B. Once the chip or die has been connected or attached to the substrate, the temperature is lowered to a temperature $t_2$ and underfill is attached either during the time when the temperature is dropping from $t_1$ to $t_2$ or at the beginning of the time when $t_2$ is held at constant as depicted by arrow 510. Once the underfill or curable material is dispensed, the temperature $t_2$ is held constant for a time sufficient for the underfill material to cure as depicted by bracket 520. Once the underfill has cured or once the epoxy material placed in contact with the die 110 and substrate 120 (shown in FIG. 1) has cured, the temperature of the substrate and die is dropped to a lower temperature. It is assumed that the lower temperature is roughly room temperature in a manufacturing site. It should also be noted that a curable material can be dispensed at the time during the temperatures $t_1$ and $t_2$ are at the beginning of the time for the curing step. The material need not necessarily be limited to an underfill material but can also be an epoxy used for overmolding the chip or die 110 and the substrate 120 (shown in FIG. 1). In other words, the time and temperature graph 500 shown in FIG. 5 can apply to either an underfill procedure or an overmolding procedure where at the part is totally encapsulated with a curable material, such as epoxy.

Figure 6:
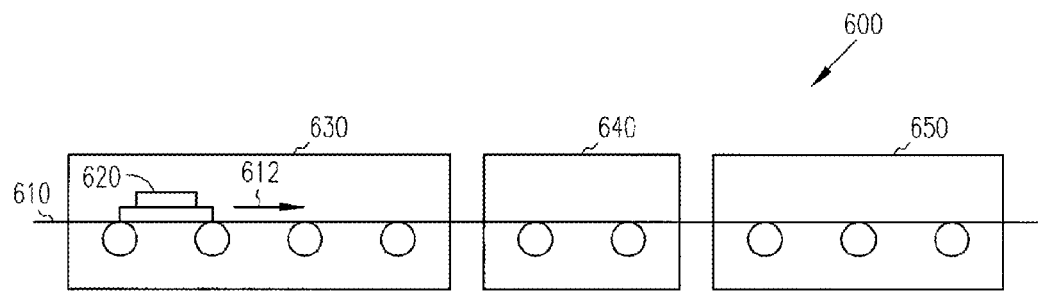
FIG. 6 is a schematic diagram of an apparatus for attaching the semiconductor package and placing a curable material in contact with the package, according to an embodiment of this invention.

FIG. 6 is a schematic diagram of a system 600 for attaching the semiconductor package and placing a curable material in contact with the package, according to an embodiment of this invention. The system 600 for forming a semiconductor package includes a conveyor 610. The die and substrate 620 that eventually form a semiconductor package, are conveyed in the direction as depicted by the arrow 612. The system 600 includes a solder reflow station 630 that heats a die and a substrate 620 to reflow solder so that the die is electrically connected to the substrate. In one embodiment of the invention, the reflow station 630 is an elongated oven through which the die and the substrate are conveyed. The rate of conveyance through the length of the oven can be controlled to allow the oven adequate time to reflow the solder. In some embodiments, the conveyor 610 constantly conveys the die and substrate 620 through the oven. In other embodiments, the conveyor 610 stops periodically to extend the amount of time the die and substrate 620 stay in the oven. The reflow station 630 operates at least at a first temperature that allows solder to reflow. The system 600 also includes a station for placing material in contact with at least a portion of the die 640 at a second temperature. The second temperature is less than the first temperature. The die and substrate 620 are heated to the first temperature and cooled to the second temperature without cooling the die and substrate to a temperature significantly below the second temperature between the solder reflow station 630 and the station for placing material in contact with at least a portion of the die 640. In one embodiment, the station for placing material in contact with a least a portion of the die 640 includes a device for placing a heated epoxy in contact with the die and the substrate. The station for placing material in contact with a least a portion of the die includes a device for underfilling the space between the die and the substrate with a heated epoxy. In one embodiment, the station for placing material in contact with a least a portion of the die includes a device for underfilling the space between the die and the substrate with a heated epoxy using capillary action. In other embodiments, the epoxy is used to underfill the die using a pressurized injection process. In still other embodiments, the station for placing material in contact with at least a portion of the die 640 includes a device used to overmold the die and substrate to form the package. The system 600 further includes a curing station 650 for holding the die and substrate at the second temperature for a time sufficient to allow the epoxy to cure. In one embodiment of the invention, the curing station 650 is another oven through which conveyor 610 conveys the die and substrate. The rate of conveyance through the length of the oven can be controlled to allow the oven adequate time to cure the epoxy or other curable material. In some embodiments, the conveyor 610 constantly conveys the die and substrate 620 through the oven. In other embodiments, the conveyor 610 stops periodically to extend the amount of time the die and substrate 620 stay in the curing oven.

Figure 7:
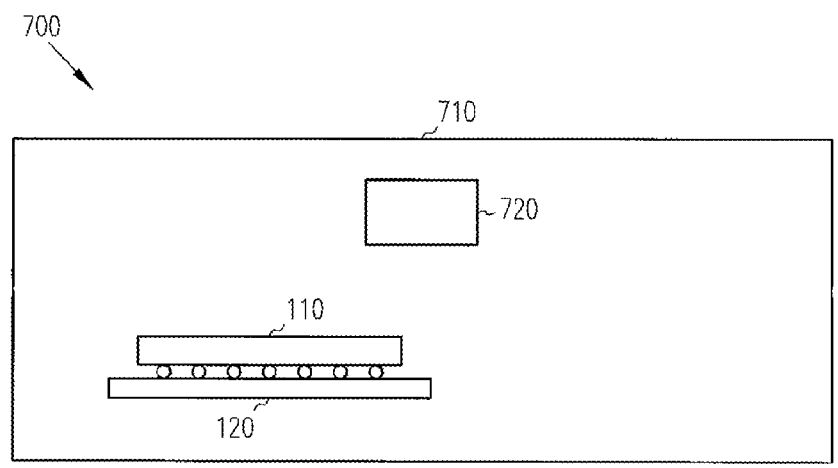
FIG. 7 is a schematic diagram of an apparatus for attaching the semiconductor package and placing a curable material in contact with the package, according to another embodiment of this invention.

FIG. 7 is a schematic diagram a system 700 for attaching the semiconductor package and placing a curable material in contact with the package, according to another embodiment of this invention. In some embodiments, the system 700 includes a plurality of stations for placing material in contact with at least a portion of the die and the solder reflow station are located at a single location. In still other embodiments, the system 700 includes the station for placing material in contact with at least a portion of the die, the solder reflow station placing material, and the curing station at a single location. The system 700 includes a single oven 710 into which the die and substrate are placed at a first temperature to cause solder reflow, and that drops to a second lesser temperature for curing of epoxy placed as either an underfill or for encapsulation of the die and substrate. The system 700 also includes a device 720 for placing the epoxy or other material in contact with the die. There may also be a curing temperature. The system holds the oven at the curing temperature for a time sufficient to allow the epoxy to cure.

The die 110 and substrate 120 may be conveyed through the oven 710 or there may be a robotic picking mechanism for picking and placing the die 110 and substrate 120 during the chip attack and package competition portion of manufacturing.

Figure 8:
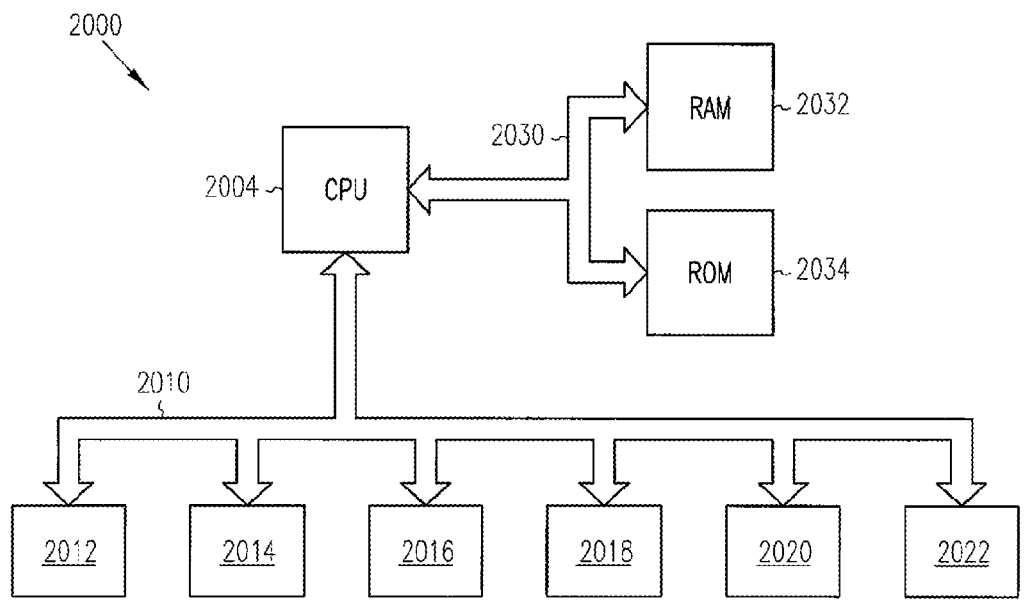
FIG. 8 is a schematic diagram of a computer system that can be used to control the apparatus for attaching the semiconductor package and curing a material in contact with the package, according to an embodiment of this invention.

Each of the systems 600, 700 for attaching the semiconductor package and placing a curable material in contact with the package can be operated under the control of a computer. FIG. 8 is a schematic diagram of a computer system 2000 that can be used to control the system 600, 700 for attaching the semiconductor package and curing a material in contact with the package, according to an embodiment of this invention. The computer system 2000 may also be called an electronic system or an information handling system. The computer or information handling system 2000 includes a central processing unit 2004, a random access memory 2032, a read only memory 2034, and a system bus 2030 for communicatively coupling the central processing unit 2004 and the random access memory 2032 and the read only memory. The information handling system 2002 also includes an input/output bus 2010 and several devices peripheral devices, such as 2012, 2014, 2016, 2018, 2020, and 2022 may be attached to the input output bus 2010. Peripheral devices may include hard disc drives, magneto optical drives, floppy disc drives, monitors, keyboards and other such peripherals.

Figure 9:
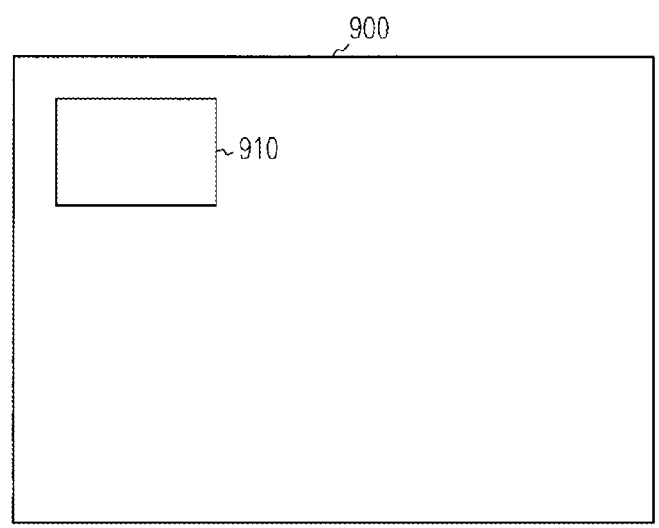
FIG. 9 is a block diagram of a computer-readable medium that includes an instruction set therein, according to an embodiment of this invention.

FIG. 9 is a block diagram of a computer-readable medium 900 that includes an instruction set 910 therein. The computer-readable medium can be any type of memory, a disk used for magnetic disk storage, optical disk storage, flash memory devices, or other machine-readable media. Media can also be read-only memory or random-access memory, which is part of a hardware configuration for a computer system. Furthermore, the media can also include the internet, storage available to a server, or a transmission of any sort, connected or wireless, that is used to transmit the instructions to a computer system.

A computer program product for use with a computer system associated with a device such as a set of stations in a semiconductor packaging operation, the computer program product includes a computer usable medium that causes a computer to execute the methods and processes set forth in FIGS. 2-4 above. In other words, a set of instructions 910 associated with the computer program product and executable by a suitably programmed information handling system and embodied in the computer usable medium causes the computer system 800 to execute the methods and processes set forth in FIGS. 2-4 and detailed in the above paragraphs.

It is to be understood that the above description is intended to be illustrative and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An assembly of a package for a semiconductor device comprising:
    a substrate;
    an integrated circuit (IC) die disposed on the substrate;
    a number of electrical connections extending between the IC die and the substrate, each of the electrical connections including a solidified solder material, the solidified solder material having a reflow temperature;
    a gap between the IC die and the substrate, wherein the solidified solder material of each electrical connection is disposed in the gap; and
    an underfill layer disposed in the gap, the underfill layer including a liquid curable material capable of being placed in the gap, at least in part, by capillary action, wherein a curing temperature of the liquid curable material is less than the reflow temperature.

2. The assembly of claim 1 wherein the liquid curable material comprises a liquid curable epoxy.

3. The assembly of claim 1 wherein the liquid curable material comprises a material that comprises a lower melting temperature than the melting temperature of the solidified solder material.

4. The assembly of claim 1 wherein the die comprises a flip chip die.

5. The assembly of claim 1 wherein the solidified solder material comprises solder ball interconnect structures.

6. The assembly of claim 1 wherein the curing temperature is above ambient temperature.

* * * * *